(12) United States Patent
Hussaini et al.

(10) Patent No.: US 7,272,008 B2
(45) Date of Patent: Sep. 18, 2007

(54) PORTABLE POWER INVERTER WITH PASS THROUGH DEVICE

(75) Inventors: Saied Hussaini, Miami, FL (US); Marc Iacovelli, Miami, FL (US)

(73) Assignee: Intec, Inc., Miami, FL (US)

( * ) Notice: Subject to any disclaimer, the term of this patent is extended or adjusted under 35 U.S.C. 154(b) by 206 days.

(21) Appl. No.: 10/795,217

(22) Filed: Mar. 9, 2004

(65) Prior Publication Data

US 2005/0200206 A1 Sep. 15, 2005

(51) Int. Cl.
*H05K 7/20* (2006.01)
(52) U.S. Cl. ................ 361/715; 361/601; 361/720
(58) Field of Classification Search ........ 361/712–714, 361/707, 687, 697, 702; 363/144, 146
See application file for complete search history.

(56) References Cited

U.S. PATENT DOCUMENTS

| 4,872,102 | A | * | 10/1989 | Getter | 363/141 |
| 5,077,652 | A | * | 12/1991 | Faley | 363/97 |
| 5,170,336 | A | | 12/1992 | Getter et al. | |
| 5,321,596 | A | * | 6/1994 | Hurst | 363/8 |
| 5,355,300 | A | * | 10/1994 | Zinn | 363/146 |
| 5,687,066 | A | * | 11/1997 | Cook, II | 363/89 |
| 5,742,478 | A | | 4/1998 | Wu | |
| 5,744,934 | A | * | 4/1998 | Wu | 320/111 |
| 5,829,993 | A | * | 11/1998 | Wu | 439/131 |
| 5,901,056 | A | * | 5/1999 | Hung | 363/142 |
| 5,982,138 | A | * | 11/1999 | Krieger | 320/105 |
| 6,111,772 | A | * | 8/2000 | Lee et al. | 363/146 |
| 6,411,514 | B1 | | 6/2002 | Hussaini | |
| 6,434,032 | B1 | * | 8/2002 | Romano | 363/146 |
| 6,577,098 | B2 | * | 6/2003 | Griffey et al. | 320/104 |
| 6,621,724 | B1 | * | 9/2003 | Liu | 363/146 |
| 6,628,535 | B1 | * | 9/2003 | Wu | 363/146 |
| 6,747,246 | B2 | * | 6/2004 | Crandell, III | 219/130.1 |
| 6,774,603 | B2 | * | 8/2004 | Liao | 320/107 |
| 6,842,356 | B2 | * | 1/2005 | Hsu | 363/146 |
| 7,011,538 | B2 | * | 3/2006 | Chang | 439/172 |

* cited by examiner

*Primary Examiner*—Tuan T. Dinh
(74) *Attorney, Agent, or Firm*—Berenato, White & Stavish

(57) ABSTRACT

A portable power inverter having a pass through device to facilitate connection and operation of both A.C. and D.C. power consuming devices to a single outlet of a single D.C. power source. Inverter circuitry is electrically coupled to the external D.C. power source for inverting D.C. voltage to an A.C. voltage source. A.C. electrical outlets are provided to facilitate a connection to an external A.C. power-consuming device. The pass through device provides an independent and simultaneous connection to an additional D.C. outlet to allow connection an external D.C. power-consuming device. The pass through device allows connection of D.C. consuming devices that would otherwise be connected directly to the external D.C. power source while the inverter is so connected thus allowing connection and operation of both A.C. and D.C power consuming devices through a single external D.C. power outlet of a single D.C. power source.

18 Claims, 6 Drawing Sheets

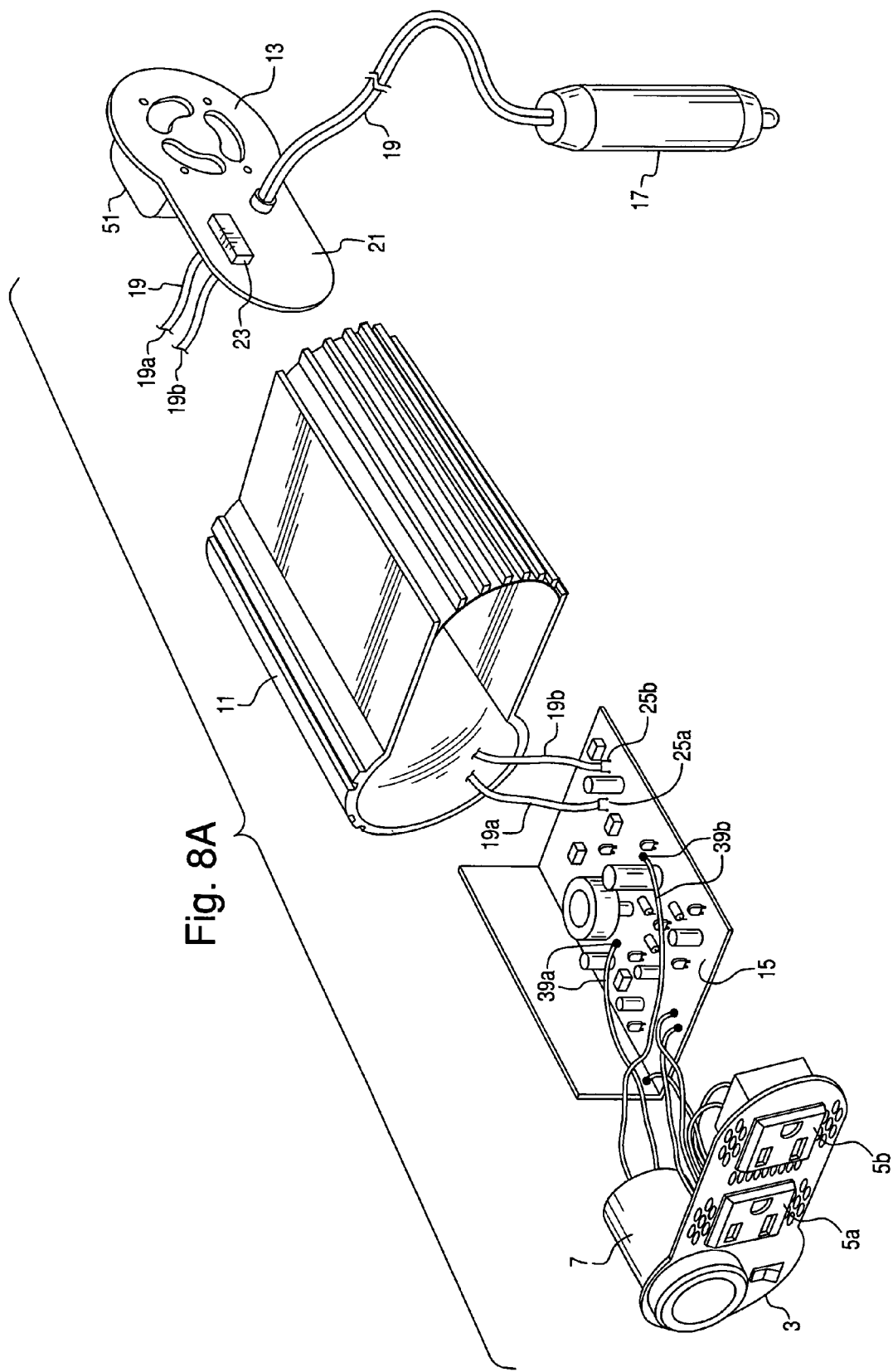

PORTABLE POWER INVERTER WITH PASS THROUGH DEVICE

BACKGROUND OF THE INVENTION

1. Field of the Invention

The invention is related to a power inverting device and more particularly to a portable power inverting device having a pass through device for connection and operation of both A.C. and D.C. power consuming devices to a single outlet of a single power source.

2. Background of the Related Art

Portable power inverter devices are well known in the art. These devices often provide a source of A.C. electrical power to run A.C. devices when in an environment where only a D.C. voltage source is available such as in an automobile. Power inverters provide the ability to power A.C. consuming devices when only such D.C. power sources are available. Examples of such power inverters are disclosed in the following U.S. patents, each of which are herein incorporated by reference: U.S. Pat. Nos. 6,411,514; 5,742,478; and 5,170,336. However, while these and other prior art inverters are connected to the D.C. power source, that connection/D.C. source is no longer useable while the inverter is connected.

SUMMARY OF THE INVENTION

The present invention is directed to a portable power inverter having a housing enclosing power inverting circuitry. An electrical connector connects the housing to an external D.C. voltage source. The circuit assembly supported within said housing is electrically coupled to the external D.C. power source. The circuit assembly includes inverter circuit equipped with electrical components for inverting the supplied D.C. voltage to an A.C. voltage source. A.C. electrical outlets are provided to facilitate a connection to an external A.C. power consuming device. A pass through device provides an independent and simultaneous connection to an additional D.C. outlet to allow connection of an external D.C. power consuming device. The pass through device allows connection of D.C. consuming devices that would otherwise be connected directly to the external D.C. power source while the inverter is so connected thus allowing connection and operation of both A.C. and D.C power consuming devices through a single external D.C. power outlet of a single D.C. power source.

BRIEF DESCRIPTION OF THE DRAWINGS

The above mentioned and other features and objects of this invention, and the manner of attaining them, will become more apparent and the invention itself will be better understood by reference to the following description of an embodiment of the invention taken in conjunction with the accompanying drawings, wherein:

FIG. 8*a* is an exploded view of the power inverter according to the present invention.

DESCRIPTION OF THE PRESENT INVENTION

Figure 1:
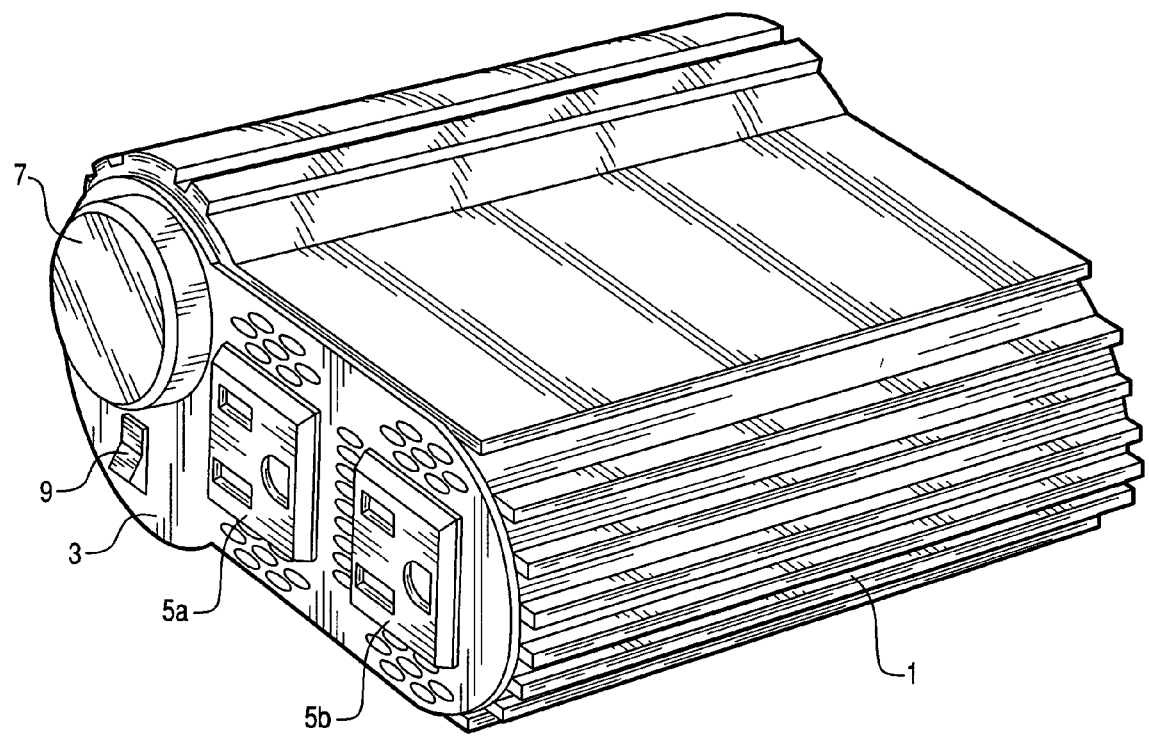
FIG. 1 is a perspective view of the Power Inverter according to the present invention.
Figure 2:
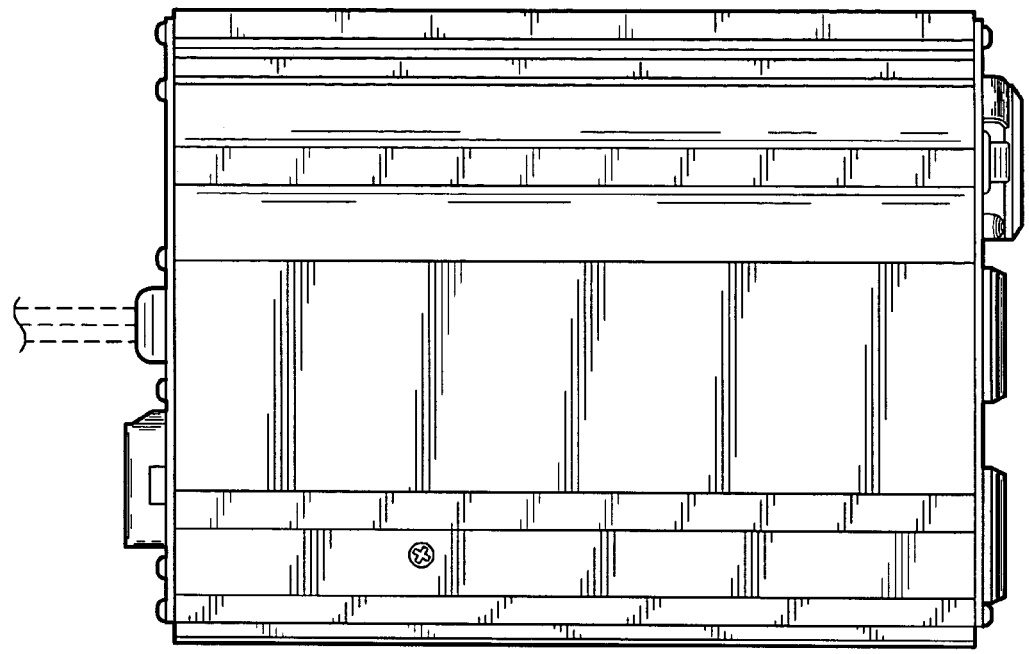
FIG. 2 is a bottom side view of the Power Inverter of FIG. 1.
Figure 3:
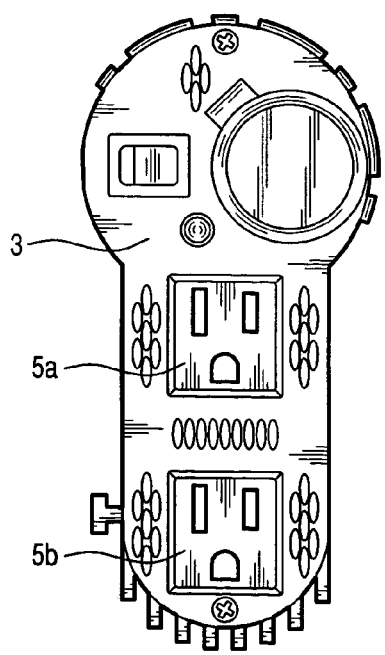
FIG. 3 is a front side view of the Power Inverter of FIG. 1.
Figure 4:
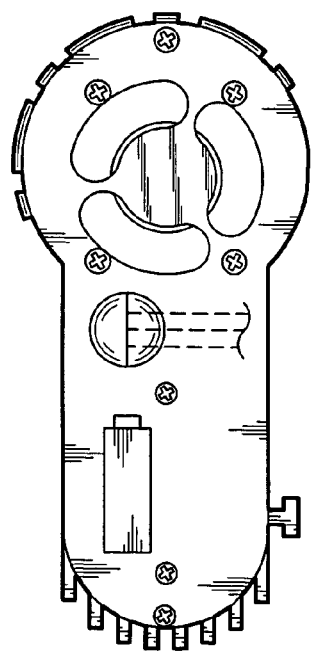
FIG. 4 is a back side view of the Power Inverter of FIG. 1.
Figure 5:
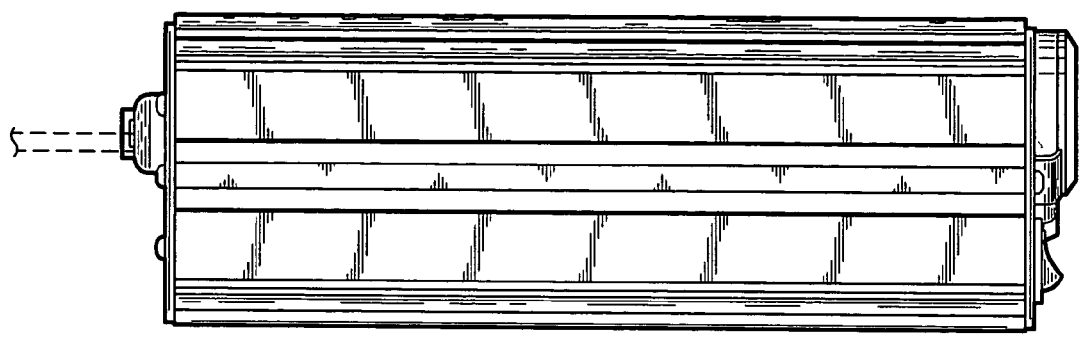
FIG. 5 is a left side view of the Power Inverter of FIG. 1.
Figure 6:
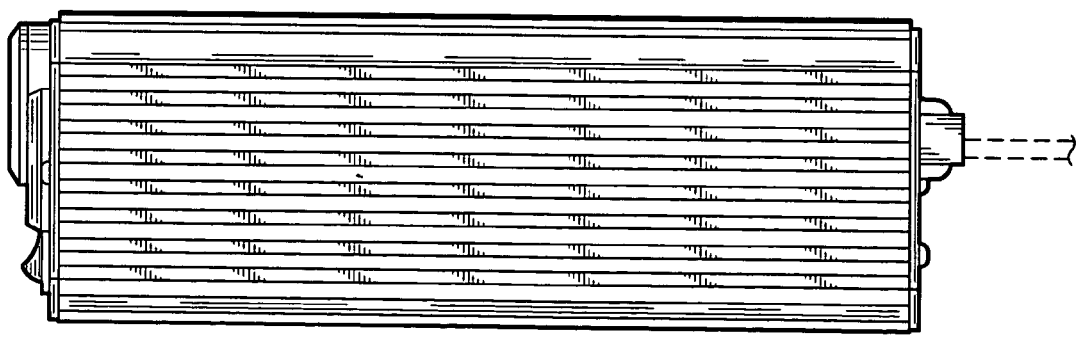
FIG. 6 is a right side view of the Power Inverter of FIG. 1.
Figure 7:
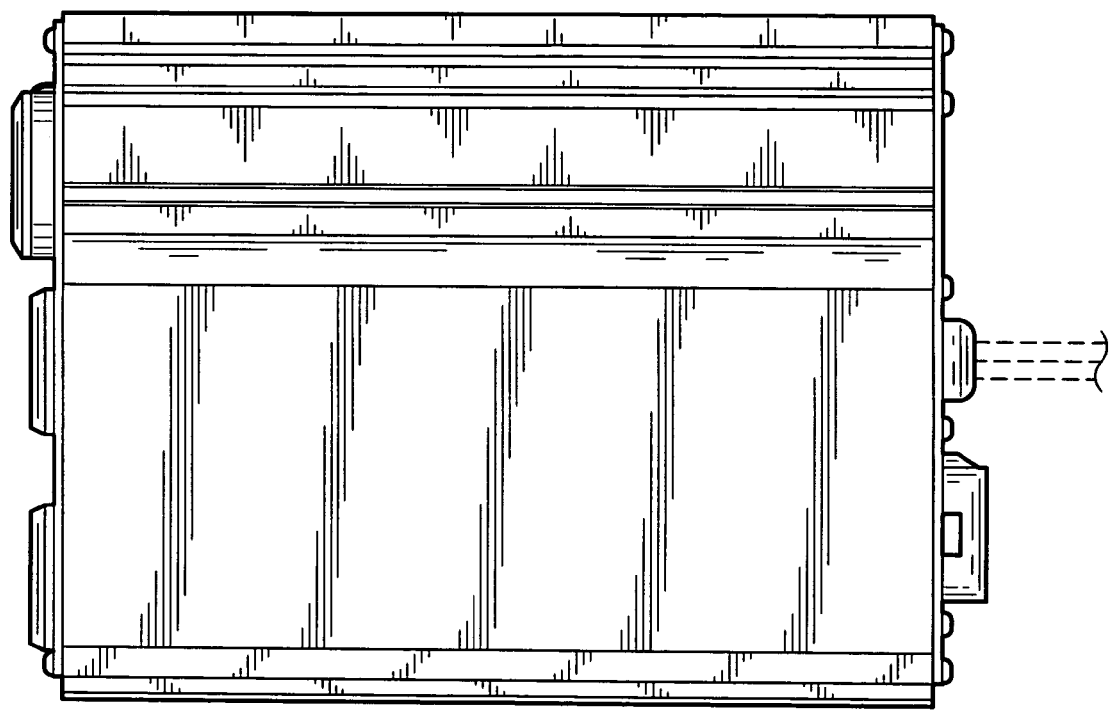
FIG. 7 is a top side view of the Power Inverter according to the present invention.

FIG. 1. depicts a persective view of the pwer inverter according to the present invention. FIGS. 2-7 depict the six side views of the inverter of FIG. 1. A housing 11 made of aluminum or other suitable hard material encloses much of the working components of the inverter 1 with a pair of end plates 3,13 form to enclose the housing. As shown in FIG. 1, the end plate 3 has multiple outlets; two A.C. outlets 5*a*, 5*b*, a D.C. outlet 7 and a power switch 9. The D.C. outlet represents a pass-through outlet to maintain an available D.C. power source and will be discussed in further detail below.

FIG. 8*a* depicts an exploded view of the inverter of FIG. 1 exposing the essential working components. It is first to be understood, that power inverters for converting a 12 volt power source to an available 110 volt A.C. source is old and well known in the art. Conventionally, these components are mounted on a printed circuit board such as shown in FIG. 8*a*. The printed circuit board has the essential components to convert a 12-volt power source for running an A.C. current consuming device. Such off the shelf circuitry is readily available to one of ordinary skill in the art. Thus no further details regarding the component circuitry or details regarding power inverting in general need to be discussed in further detail. Any power inverting circuitry for inverting 12 volts to A.C. voltage to run an A.C. consuming device may be employed. It is also understood the inverter circuitry can be designed for various power ratings over a range of watts. For example, a small 100 watt power inverter may be desirable for extreme portability to power low power consuming A.C. devices such as a clock or radio. The wattage rating may be increased to exceed 1000 watts depending on the intended application for the inverter. Such arrangements are well known in the art and are readily available. The present invention is primarily directed to the arrangement of power inverter components employing a pass through device to maintain the availability of the 12-volt source which powers the inverter. Thus the remaining discussion will be directed to such an arrangement.

As previously mentioned, the present invention includes two A.C. outlets 5*a*, 5*b* mounted on the end plate 3. The outlets 5*a*, 5*b* are intended to power two different A.C. consuming devices by inverting a 12 volt (or other low voltage D.C. source) to A.C. Such a D.C. voltage source is often found in automobiles. For such use, the present invention includes a male plug type cigarette electrical connector 17 for insertion into a female cigarette outlet commonly found in automobiles as well as other 12-volt power sources. Power leads (positive and ground) 19 extend from the male plug 17 through a rear end plate 21 to connect the D.C. voltage source to the printed circuit board 15. The power leads may first pass through a fuse box 23 prior to connecting to printed circuit board 15 as is conventionally known in the art.

The power leads 19 include a positive lead 19*a* and ground lead 19*b* which are connected/soldered to corresponding points on the printed circuit board 15. Preferably the leads 19*a*, 19*b* are connected via removable connectors 25*a*, 25*b* which extend through the printed circuit board and are soldered to corresponding positive lines 27/28 at two points 27a,27b and 28a,28b to ensure a secure connection to the circuit board. Thus the leads 19 bring power from an external D.C. voltage source to the inverter circuitry. The A.C. outlets 5a,5b are connected to corresponding points on the printed circuit board as is conventional in the art and generally depicted in FIG. 8a. As the connection and supply of A.C. current to A.C. outlets in an inverter is well within the knowledge of one of ordinary skill in the art, no further elaboration is necessary.

As previously discussed, it is desirable to make available a D.C. receptacle outlet to maintain a D.C. power source otherwise occupied by male plug 17. Thus the inverter of the present invention includes a pass through device to maintain the availability of a D.C. outlet while the inverter is connected to the external D.C. power source. The present invention includes a female cigarette plug type outlet 7 disposed on end plate 3 adjacent A.C. outlets 5a, 5b. The D.C. outlet 7 is comprised of a common female receptacle as commonly employed as cigarette lighters in vehicles. The female outlet 7 is correspondingly dimensioned to accommodate the male plug 17 connecter and thus mirrors the female socket of the external D.C. voltage source to which the male plug 17 is normally connected.

Figure 8B:
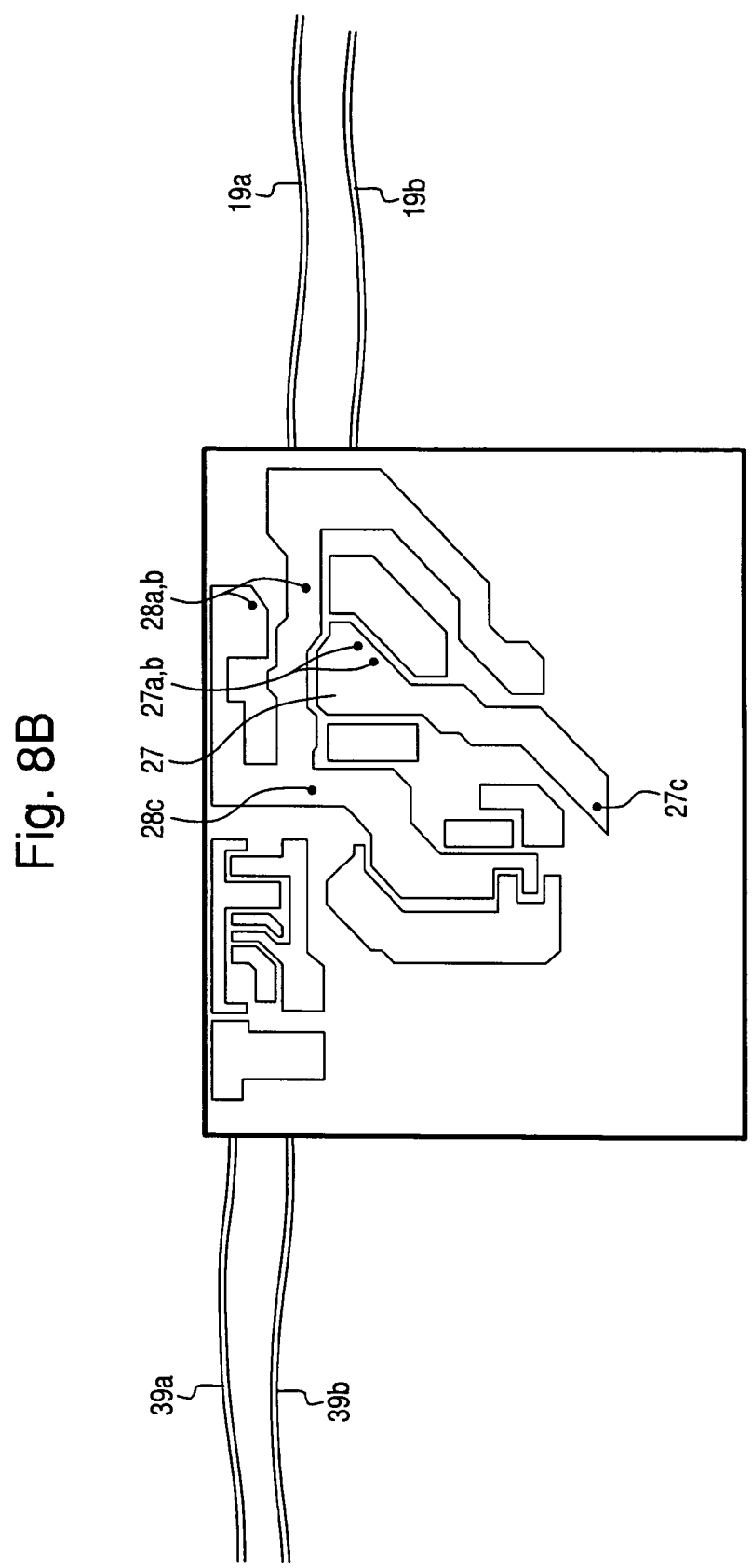
FIG. 8*b* is an isolated view showing a rear side portion of the printed circuit board.

To power the D.C. female outlet 7, a positive lead 39a is connected through the printed circuit board and connected to positive line 27 at point 27c as shown in FIGS. 8A & 8B. Similarly ground line 39b extends from the female outlet 7 through the printed circuit board 15 and is connected to ground line 28 at point 28c. Thus the female outlet 7 draws current directly from external D.C. power source in parallel to the inverter circuitry. Such an arrangement facilitates simultaneous use of the A.C. outlets and the D.C. outlet to the extent the load is not excessive relative to the rating of the external D.C. voltage source to which the inverter is connected. Should the load exceed a predetermined value, the fuse 23 would open the circuit isolating the inverter circuitry and female D.C. outlet 7 from the power source.

Thus the present invention provides a compact portable arrangement for inverting a D.C. voltage source to power an A.C. consuming device and incorporate a pass through device to simultaneously maintain the availability of a D.C. power source. The inverter unit effectively provides outlets to run both A.C. power consuming devices as well as D.C. power consuming devices simultaneously without having to make or break any connection between the inverter and original external D.C. power source.

To further enhance the performance of the inverter circuitry, each end plate are provided with ventilation holes to allow air to pass through the housing 11 and cool the electrical components during use. A fan 51 may also be employed to positively force air through the housing and may be connected to the inverter assembly as is commonly known in the art.

While this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains. For example, only a portion of the printed lines are depicted in FIG. 8B sufficient to demonstrate the connection of lead lines 19 to the circuit as well as the connection of the D.C. receptacle to appropriate lines on the board. Other printed circuitry arrangements may be employed to facilitate a parallel connection between the D.C. outlet and inverting circuitry.

What is claimed is:

1. A power inverter comprising:
   a housing;
   a first electrical connector for connecting said inverter to an external D.C. voltage source;
   a circuit assembly supported within said housing and electrically coupled to said first electrical connector to facilitate a connection to said D.C. power source, said circuit assembly comprising an inverter circuit equipped with electrical components for converting said external D.C. voltage source to an A.C. voltage source for consumption by an external A.C. power consuming device;
   an A.C. electrical outlet connected to said housing provided to facilitate a connection to said external A.C. power consuming device, said A.C. electrical outlet being powered by said A.C. voltage source when said first electrical connector is connected to said external D.C. power source; and
   a pass through device having a D.C. electrical outlet to facilitate a connection to and providing a D.C. voltage source to an external D.C. power consuming device when said first electrical connector is connected to said external D.C. power source.

2. The inverter according to claim 1, wherein said first electrical connector is a male plug connector adapted to mate with a female socket of said external D.C. voltage source, said D.C. electrical outlet is a female socket correspondingly dimensioned to accommodate said male plug connector thereby mirroring said female socket of said external D.C. voltage source.

3. The inverter according to claim 1, wherein said first electrical connector is a male cigarette-type 12 volt plug connector adapted to mate with a female cigarette-type 12 volt socket of said external D.C. voltage source, said D.C. electrical outlet is a female cigarette-type 12 volt socket connector thereby mirroring said female cigarette-type 12 volt socket of said external D.C. voltage source.

4. The inverter according to claim 1 wherein said A.C. electrical outlet includes a plurality of A.C. electrical outlets.

5. The inverter according to claim 1, wherein said D.C. electrical outlet and said inverter circuitry are connected to said first electrical connector in parallel.

6. The power inverter according to claim 1, further comprising a front end plate and a rear end plate secured to said housing in a manner so as to enclose said circuit assembly within said housing, wherein at least one of said front end plate and said rear end plate include a plurality of ventilation holes through which air can pass to and from the interior of the housing.

7. The inverter according to claim 5, wherein said circuit assembly includes a printed circuit board, said first electrical connector being electrically coupled to said printed circuit board and thereby establishing a connection from a positive and a ground line of said external D.C. voltage source to corresponding leads of said printed circuit board, said corresponding leads of said printed circuit board each being electrically connected to each of said D.C. electrical outlet and said inverter circuitry thereby simultaneously providing power to each of said D.C. electrical outlet and said A.C. electrical outlet.

8. The power inverter according to claim 6, further comprising an intake fan mounted to one of said front end plate and said rear end plate to intake cooling air and circulate air within the housing to increase heat dissipation from the heat sink plate to the air and then to the housing.

9. The power inverter according to claim 6, wherein said first electrical connector extends through a first one of said front end plate and said rear end plate, and said A.C. electrical outlet and said D.C. electrical outlet being mounted through a second one of said front end plate and said rear end plate.

10. A power inverter comprising:
a compact portable housing;
a first electrical connector for connecting said inverter to an external D.C. voltage source;
a circuit assembly supported within said housing and electrically coupled to said first electrical connector to facilitate a connection to said D.C. power source, said circuit assembly comprising an inverter circuit equipped with electrical components for converting said external D.C. voltage source to an A.C. voltage source for consumption of an external A.C. power consuming device;
an A.C. electrical outlet connected to said housing provided to facilitate a connection to said external A.C. power consuming device, said A.C. electrical outlet being powered by said A.C. voltage source when said first electrical connector is connected to said external D.C. power source; and
a pass through device having a D.C. electrical outlet to facilitate a connection to an external D.C. power consuming device that would otherwise be directly powered by said external D.C. power source when said first electrical connector is connected to said external D.C. power source and simultaneously providing a source of D.C. voltage substantially mirroring said external D.C. power source and to said external D.C. voltage power consuming device while said A.C. electrical outlet is powered by said A.C. voltage source and thereby simultaneously providing said A.C. voltage source to said external A.C. power consuming device.

11. The inverter according to claim 10, wherein said first electrical connector is a male plug connector adapted to mate with a female socket of said external D.C. voltage source, said D.C. electrical outlet is a female socket correspondingly dimensioned to accommodate said male plug connector thereby precisely mirroring said female socket of said external D.C. voltage source to provide a source of D.C. power to a device having an identical male plug connector.

12. The inverter according to claim 10, wherein said first electrical connector is a male cigarette-type 12 volt plug connector adapted to mate with a female cigarette-type 12 volt socket of said external D.C. voltage source, said D.C. electrical outlet is a female cigarette-type 12 volt socket connector thereby precisely mirroring said female cigarette-type 12 volt socket of said external D.C. voltage source.

13. The inverter according to claim 10, wherein said D.C. electrical outlet and said inverter circuitry are connected to said first electrical connector in parallel.

14. The inverter according to claim 11, wherein said A.C. electrical outlet includes a plurality of A.C. electrical outlets.

15. The inverter according to claim 14, wherein said circuit assembly includes a printed circuit board, said first electrical connector being electrically coupled to said printed circuit board and thereby establishing a connection from a positive and a ground line of said external D.C. voltage source to corresponding leads of said printed circuit board, said corresponding leads of said printed circuit board each being electrically connected to each of said D.C. electrical outlet and said inverter circuitry thereby simultaneously providing power to each of said D.C. electrical outlet and said A.C. electrical outlet.

16. The power inverter according to claim 11, further comprising a front end plate and a rear end plate secured to said housing in a manner so as to enclose said circuit assembly within said housing, wherein at least one of said front end plate and said rear end plate include a plurality of ventilation holes through which air can pass to and from the interior of the housing.

17. The power inverter according to claim 16, further comprising an intake fan mounted to one of said front end plate and said rear end plate to intake cooling air and circulate air within the housing to increase heat dissipation from the heat sink plate to the air and then to the housing.

18. The power inverter according to claim 16, wherein said first electrical connector extends through a first one of said front end plate and said rear end plate, and said A.C. electrical outlet and said D.C. electrical outlet being mounted through a second one of said front end plate and said rear end plate.

* * * * *